United States Patent [19]

Prabhu et al.

[11] 4,369,254

[45] Jan. 18, 1983

[54] CROSSOVER DIELECTRIC INKS

[75] Inventors: Ashok N. Prabhu, Plainsboro; Kenneth W. Hang, Princeton Junction, both of N.J.

[73] Assignee: RCA Corporation, New York, N.Y.

[21] Appl. No.: 280,916

[22] Filed: Jul. 6, 1981

[30] Foreign Application Priority Data

Oct. 17, 1980 [GB] United Kingdom ................ 8033567

[51] Int. Cl.³ .......................... H05K 3/46; C03C 3/08
[52] U.S. Cl. ....................................... 501/21; 427/96; 501/77
[58] Field of Search ....................... 501/21, 77; 427/96

[56] References Cited

U.S. PATENT DOCUMENTS

| | | | |
|---|---|---|---|
| 3,022,179 | 2/1962 | Morrissey | 501/77 |
| 3,816,172 | 6/1974 | Hoffman | 501/77 |
| 4,141,055 | 2/1979 | Berry | 427/96 |
| 4,256,796 | 3/1981 | Hang | 501/5 |
| 4,256,796 | 3/1981 | Hang et al. | 428/210 |

FOREIGN PATENT DOCUMENTS

1025125 8/1964 United Kingdom .

OTHER PUBLICATIONS

Sproull et al., "A High Performance Gold/Dielectric/Resistor Multilayer System", Proceedings of the 1974 International Microelectronic Symposium, Oct. 24-26, 1974, pp. 20-24.

Cole et al., "High Temperature Viscosity Control in Multi-layer Glasses-A New Concept", Proceedings of the 1974 International Microelectronic Symposium, Oct. 21-23, 1974, pp. 25-34.

*Primary Examiner*—John D. Smith
*Attorney, Agent, or Firm*—Birgit E. Morris; R. Hain Swope

[57] ABSTRACT

Novel thick-film crossover dielectric inks useful in constructing multilayer circuits on suitable substrates are provided. The subject inks comprise a barium magnesium borosilicate glass powder, a pinhole reducing component comprising silicon dioxide, an alkaline earth aluminum borosilicate glass having a high softening point or mixtures thereof and a suitable organic vehicle.

7 Claims, No Drawings

CROSSOVER DIELECTRIC INKS

This invention pertains to thick film crossover dielectric inks and their use in constructing multilayer electrical circuit structures on porcelain-coated metal substrates.

BACKGROUND OF THE INVENTION

The use of specialized ink formulations to form thick films having various functions on suitable substrates in the construction of multilayer integrated circuit structures is well known in the art. Such technology is of increasing interest in the fabrication of very dense multilayer circuit patterns on various substrates for a wide variety of applications in the electronics industry.

Significantly improved substrates for the fabrication of such circuits are disclosed and claimed in Hang et al., U.S. Pat. No. 4,256,796, issued Mar. 17, 1981, the disclosure of which is incorporated herein by reference. The Hang et al. substrates are metal coated with an improved porcelain composition comprised of a mixture, based on its oxide content, of magnesium oxide (MgO) or mixtures of magnesium oxide and certain other oxides, barium oxide (BaO), boron trioxide ($B_2O_3$) and silicon dioxide ($SiO_2$). The preferred metal is steel, particularly low carbon steel, which may be coated with various other metals such as, for example, copper. The porcelain compositions are applied to the metal core and fired to provide a partially devitrified porcelain coating on the metal core. The coating has a very low viscosity at its initial fusion point and then almost instantaneously obtains a high viscosity due to devitrification. The fired coatings which are preferred for hybrid circuit applications have a deformation temperature of at least 700° C. and a high coefficient of thermal expansion of at least about $110 \times 10^{-7}/°C$.

While the porcelain-coated metal substrates of Hang et al. represent a significant improvement over previously known substrate materials, they are disadvantageous only in being incompatible or poorly compatible with commercially available thick film inks. In accordance with this invention, improved crossover dielectric inks are provided which are compatible with the Hang et al. porcelain metal substrates.

SUMMARY OF THE INVENTION

The improved crossover dielectric inks provided in accordance with this invention are based on the system $BaO-MgO-B_2O_3-SiO_2$. In addition to the barium magnesium borosilicate devitrifying glass powder, the novel inks of this invention contain a pinhole-reducing component comprising silicon dioxide powder, an alkaline earth aluminum borosilicate glass having a high softening point or mixtures thereof, and a suitable organic vehicle.

DETAILED DESCRIPTION OF THE INVENTION

In accordance with this invention, there are provided improved crossover dielectric inks useful in the production of complex, multilayer thick film integrated circuits on porcelain-coated metal substrate boards. Crossover dielectric films provide insulation between intersecting layers of conductors in a multilayered circuit array. Conventional thick-film dielectric inks generally consist of a mixture of dielectric oxide powder and a low softening point glass frit with a suitable screening medium.

It is generally recognized that films formed from crossover dielectric inks should possess: a thermal coefficient of expansion reasonably close to that of the substrate being utilized; good mechanical strength and reheat stability; little porosity in general and no open porosity to prevent shorts between the top and bottom conductors; chemical compatibility with the conductor pads; low dielectric constant; high insulation resistance; and good voltage breakdown characteristics. The crossover dielectric inks of this invention satisfy all of these criteria and, in addition, possess excellent compatibility with the aforementioned Hang et al. porcelain-coated metal circuit boards. The crossover dielectric inks of this invention are likewise compatible with various types of thick-film inks formulated for the Hang et al. porcelain-coated metal substrates, thus providing a significant advance in multilayer integrated circuit systems.

The crossover dielectric inks of this invention are unique in that they may be fired in either air or inert environments, e.g. nitrogen. Since most conventional inks are fireable in only one of these environments, the capacity of the inks of this invention to be fired in either atmosphere is particularly advantageous in the production of highly complex multilayer integrated circuits.

The subject dielectric inks are based on the system $BaO-MgO-B_2O_3-SiO_2$ and are specially formulated so that, during initial firing, a liquid/liquid phase separation occurs. One of the phases begins to precipitate from the glass as microcrystals. These microcrystals build slowly into polycrystalline bodies which are exceptionally stable during reheating. The resulting films are therefore partially devitrified with the polycrystalline mass comprising from about 60 to about 75 percent by volume of the film. The partial devitrification of the inks of this invention during firing, in a sense, forms an in situ ceramic. The inks of this invention are formulated to achieve this effect and to minimize pinholes in the thick-films prepared therefrom.

The glass frit component of the inks of this invention consists of, on a weight basis:

(a) from about 17 to about 49 percent of barium oxide;

(b) from about 16 to about 43 percent of magnesium oxide;

(c) from about 13 to about 33 percent of boron trioxide; and (d) from about 8 to about 22 percent of silicon dioxide.

The barium oxide may be replaced in part by including up to 12 percent by weight, based on the total frit, of lanthanum oxide ($La_2O_3$). The partial replacement of BaO with $La_2O_3$ modifies the crystal structure somewhat for particular applications. The glass composition may additionally contain small amounts of a mixture of phosphorous pentoxide ($P_2O_5$) and zirconium oxide ($ZrO_2$) which acts to further retard the rate of crystallization. Such mixture, when present, comprises up to about 6 percent by weight, preferably from about 3 to about 4 percent by weight, of the glass frit. The mixture contains $P_2O_5$ and $ZrO_2$ in a weight ratio of between about 1:2 and 1:7, preferably between about 1:3 and 1:4. The glass frit comprises from about 30 to about 70 percent by weight of the total ink composition.

The pinhole reducing component of the novel crossover dielectric inks of this invention consists of silicon dioxide, an alkaline earth aluminum borosilicate glass having a high softening point or mixtures thereof, with mixtures being preferred. The presence of this component in the subject inks helps slow the rate of crystallization and, more importantly, provides a physical aid to entrapped gas bubbles which result from decomposition or volatilization of the organic vehicle during firing so that they may reach the surface of the ink and escape into the environment. By aiding the gas to escape more rapidly and exerting a retarding effect on crystallization, this component virtually eliminates through pinholes and significantly reduces pinhole density in films in excess of 1 mil thick, formed from the inks of this invention.

The terminology "high softening point" with regard to the glass utilized as a pinhole reducing component in the context of this invention means an alkaline earth aluminum borosilicate glass having a softening point in excess of 700° C. A preferred glass is based on the system $BaO-CaO-B_2O_3-Al_2O_3-SiO_2$ with a particularly preferred glass having, on a weight basis, 45 to 55 percent of BaO, 6 to 15 percent of CaO, 10 to 20 percent of $B_2O_3$, 6 to 13 percent of $Al_2O_3$ and 5 to 15 percent of $SiO_2$. As stated above, it is preferred to utilize mixtures of the alkaline earth aluminum borosilicate glass and silicon dioxide as the pinhole reducing component. While these two may be mixed in any proportions, approximately equal parts by weight are preferred. The pinhole reducing component comprises from about 10 to about 30 percent, preferably from 15 to about 25 percent, by weight of the total ink composition.

The ink formulations of this invention may also contain a minor amount of a conventional colorant oxide such as the oxides of chromium, cobalt, nickel and the like. The inks of this invention contain up to about 5, preferably from about 0.1 to about 1.0, weight percent of a colorant oxide.

The solid components of the subject ink formulations have an average particle size of between about 1 and 5 μm. They are thoroughly mixed, preferably in a ball mill or other suitable grinding apparatus with an aliphatic alcohol, preferably isopropanol, for from 8–48 hours. The alcohol is then evaporated and the solids combined with from about 20 to about 50 percent, preferably from about 30 to about 40 percent, by weight, of a suitable organic vehicle to make the ink. The organic vehicles are selected to give screen printing characteristics to the inks and to burn off cleanly during firing in nitrogen or air, i.e. without leaving a carbonaceous residue.

The organic vehicles are binders such as, for example, cellulose derivatives, particularly ethyl cellulose, synthetic resins such as polyacrylates or methacrylates, polyesters, polyolefins and the like. In general, conventional vehicles utilized in inks of the type described herein may be used in the subject inks. Preferred commercially available vehicles include, for example, pure liquid polybutenes available as Amoco H-25, Amoco H-50 and Amoco L-100 from Amoco Chemicals Corporation, poly n-butylmethacrylate available from E. I. duPont de Nemours and Co., and the like.

The above resins may be utilized individually or in any combination of two or more. A suitable viscosity modifier can be added to the resin material if desired. These modifiers can be solvents such as those conventionally used in similar ink compositions, e.g. pine oil, terpineol, butyl carbitol acetate, an ester alcohol available from Texas Eastman Company under the trademark Texanol and the like or solid materials such as, for example, a castor oil derivative available from NL Industries under the trademark Thixatrol. Regardless of the vehicle utilized, it is important that dispersion and homogeneity of the solids in the vehicle be maximized. For this reason, mixing is usually carried out in conventional apparatus which disperses the mixture and subjects it to a shearing force at the same time. Generally, the higher the shearing forces, the better the resulting dispersion.

The crossover dielectric inks of this invention are applied to the substrate board, preferably the porcelain-coated metal boards of Hang et al., by conventional means, i.e. screen printing, brushing, spraying and the like with screen printing being preferred. Generally, as is conventional in the art, two individually dried and fired layers of dielectric are utilized to minimize the potential for through pinholes. The coating of ink is then dried in air at 100°–125° C. for about 15 minutes. The resulting film may be fired in air or nitrogen at temperatures from 850° to 950° C. for from 4 to 10 minutes. The dielectric films thus obtained have good mechanical strength and good reheat stability. When utilized in multilayer circuits, they have demonstrated excellent isolation between layers of copper conductors. In addition to the porcelain-coated metal boards of Hang et al, the crossover dielectric inks of this invention are compatible with and can be utilized with conventional circuit boards, e.g. alumina circuit boards.

The following Example further illustrates this invention, it being understood that the invention is in no way intended to be limited to the details described therein. In the Example all parts and percentages are on a weight basis and all temperatures are in degrees Celsius, unless otherwise stated.

EXAMPLE

Crossover dielectric inks were prepared from the following formulations:

| | Composition (percent) | | | | | |
|---|---|---|---|---|---|---|
| Ink No. | Devitrifying Glass Powder I | II | Silicon Dioxide | Colorant | High Softening Point Glass Powder | Organic Vehicle* |
| 1 | 57.14 | — | — | — | — | 42.86 |
| 2 | 47.62 | — | 19.05 | — | — | 33.33 |
| 3 | 51.95 | — | 20.78 | — | — | 27.27 |
| 4 | 53.34 | — | — | — | 13.33 | 33.33 |
| 5 | — | 42.12 | 16.84 | — | 2.11 | 38.93 |
| 6 | — | 42.74 | 17.09 | 0.43** | 6.41 | 33.33 |

*The vehicle for Ink No. 1 was a mixture of 28.57 and 14.29 percent, respectively, of the liquid polybutenes Amoco H-25 and L-100 available from Amoco Chemical Co. In Ink No. 2, a mixture of 10.00 percent Amoco H-50, 16.67 percent Amoco L-100 and 6.66 percent of the ester alcohol Texanol available from Texas Eastman Company was the vehicle. In the remaining ink formulations, the vehicle was a 13 percent solution of Elvacite 2044 in pine oil. Elvacite 2044 is a poly(n-butylmethacrylate) resin available from E.I. duPont de Nemours and Co.
**Chromium oxide In the above inks, the devitrifying glass powders had the following formulations:

| Ingredient | Formula (Percent) I | II |
|---|---|---|
| MgO | 27.83 | 41.05 |
| BaO | 37.16 | 18.22 |
| $B_2O_3$ | 20.45 | 23.63 |
| $SiO_2$ | 14.56 | 13.25 |
| $ZrO_2$ | — | 2.89 |
| $P_2O_5$ | — | 0.96 |

The high softening point glass had the following composition by weight percent: BaO (49.28), CaO (12.01), $B_2O_3$ (14.92), $Al_2O_3$ (10.92), and $SiO_2$ (12.87).

The solid ingredients were mixed in a ball mill with sufficient isopropyl alcohol to thoroughly wet them for a period of 12 hours. The alcohol was evaporated and the solids were combined with the organic vehicle. All ingredients were first hand mixed, then mixed on a 3 roll mill to obtain a smooth paste suitable for screen printing. Additional vehicle was added to replace loss during mixing and assure proper rheology.

Copper conductor inks were printed and fired onto a porcelain steel substrate of the type disclosed by Hang et al. The copper inks were air dried at 125° for about 15 minutes, then fired in nitrogen at about 850°. Samples of each of the above inks were printed over the copper electrodes through a 200 mesh stainless steel screen, 1 mil emulsion thickness. The crossover dielectric inks were dried in air at 125° for 15 minutes and fired in nitrogen in an Inconel Muffle, 5 zone, BTU Transheat belt furnace with a belt width of 6 inches at a peak temperature of 900°. Time at peak temperature was about 4-8 minutes. Total cycle time was about 30-45 minutes. A second dielectric layer was printed and fired over the first. Finally, the top copper electrode was printed, dried and fired. The fired parts were tested for electrical shorts between the top and bottom copper electrodes, dielectric constant, dielectric loss, insulation resistance and breakdown voltage of the dielectric films.

Ink No. 1 was unacceptable because of pinholes which produced shorts between the copper electrodes. Ink No. 4 had some blistering in the films. Inks 2 and 3 had significantly decreased pinholes in comparison to Ink No. 1. Inks 5 and 6 demonstrated excellent results in all tests.

We claim:

1. A crossover dielectric ink suitable for forming an intermediary film between two or more conductor films on a substrate comprising:
   (a) from about 30 to about 70 percent by weight of a partially devitrifying barium magnesium borosilicate glass powder;
   (b) from about 10 to about 30 percent by weight of a pinhole reducing component selected from the group consisting of silicon dioxide, an alkaline earth aluminum borosilicate glass having a softening point above about 700° C., and mixtures thereof; and
   (c) from about 20 to about 50 percent by weight of a suitable organic vehicle.

2. A crossover dielectric ink in accordance with claim 1, wherein said partially devitrifying glass consists essentially of:
   (a) from about 17 to about 49 percent by weight of barium oxide;
   (b) from about 16 to about 43 percent by weight of magnesium oxide;
   (c) from about 13 to about 33 percent by weight of boron trioxide;
   (d) from about 8 to about 22 percent by weight of silicon dioxide;
   (e) from 0 to about 12 percent by weight of lanthanum trioxide; and
   (f) from 0 to about 6 percent by weight of a mixture of phosphorus pentoxide and zirconium oxide in a weight ratio of from about 1:2 to about 1:7.

3. A crossover dielectric ink in accordance with claim 2, wherein said glass contains from about 3 to about 4 percent by weight of said mixture of phosphorus pentoxide and zirconium oxide.

4. A crossover dielectric ink in accordance with claim 1, wherein said alkaline earth aluminum borosilicate glass is a barium calcium aluminum borosilicate glass.

5. A crossover dielectric ink in accordance with claim 4, wherein said barium calcium aluminum borosilicate glass consists essentially of:
   (a) from about 45 to about 55 percent by weight of barium oxide;
   (b) from about 6 to about 15 percent by weight of calcium oxide;
   (c) from about 10 to about 20 percent by weight of boron trioxide;
   (d) from about 6 to about 13 percent by weight of aluminum oxide; and
   (e) from about 5 to about 15 percent by weight of silicon dioxide.

6. A crossover dielectric ink in accordance with any of claims 1, 4 and 5, wherein said pinhole reducing component is a mixture of silicon dioxide and said alkaline earth aluminum borosilicate glass.

7. A crossover dielectric ink in accordance with claim 1, wherein said ink contains up to about 5 percent by weight of a colorant oxide selected from the group consisting of chromium oxide, cobalt oxide and nickel oxide.

* * * * *